United States Patent [19]

Goodwin

[11] Patent Number: 4,847,554
[45] Date of Patent: Jul. 11, 1989

[54] CURRENT MEASURING AND MAGNETIC CORE COMPENSATING APPARATUS AND METHOD

[75] Inventor: R. Wendell Goodwin, Dunwoody, Ga.

[73] Assignee: Sangamo Weston, Inc., Norcross, Ga.

[21] Appl. No.: 21,895

[22] Filed: Mar. 4, 1987

[51] Int. Cl.$^4$ .................. G01R 19/00; G01R 19/22
[52] U.S. Cl. .................................. 324/127; 324/119
[58] Field of Search .............. 324/117 R, 127, 110, 324/119; 323/356

[56] References Cited

U.S. PATENT DOCUMENTS

| | | | |
|---|---|---|---|
| 3,708,749 | 1/1973 | Bateman et al. | 324/127 |
| 3,714,548 | 1/1973 | Macrander | 323/356 |
| 4,027,235 | 5/1977 | Macrander et al. | 323/356 |
| 4,064,449 | 12/1977 | Macrander | 323/356 |
| 4,182,982 | 1/1980 | Wolf et al. | 324/127 |
| 4,255,704 | 3/1981 | Milkovic | 324/127 |
| 4,255,705 | 3/1981 | Milkovic | 324/127 |
| 4,278,940 | 7/1981 | Milkovic | 324/127 |
| 4,513,274 | 4/1985 | Halder | 336/173 |

FOREIGN PATENT DOCUMENTS 54-97730  1/1978  Japan .

OTHER PUBLICATIONS

Carr, J. J., *Digital Interfacing with an Analog World*, 1978, pp. 100-1.

Primary Examiner—Jerry Smith
Assistant Examiner—Stephen M. Baker
Attorney, Agent, or Firm—Sanford J. Asman

[57] ABSTRACT

DC magnetic flux bias imposed on a magnetic core of a current transformer is compensated in response to an indication of the amplitude and duration of opposite polarity secondary winding current components. In a second embodiment, the magnetic bias is compensated by responding to the integral of the secondary current. The integral of the secondary current is a measure of the magnetic core flux variations. The durations of the positive and negative flux variations are compared.

16 Claims, 3 Drawing Sheets

CURRENT MEASURING AND MAGNETIC CORE COMPENSATING APPARATUS AND METHOD

TECHNICAL FIELD

The present invention relates generally to measuring AC current and more particularly to a method of and apparatus for measuring AC current by compensating for a DC magnetic flux bias introduced into a magnetic core of a current transformer as a function of asymmetric flux properties of the core resulting from DC being superimposed on the AC current being monitored.

BACKGROUND ART

Current transformers are frequently employed to monitor power line AC current level. The current transformer usually includes a magnetic core having a relatively high magnetic permeability and a primary winding coupled to a line being monitored. A multiturn secondary winding is wound on the core to drive relatively high impedance circuitry that does not substantially load the primary winding. Such structures are used to monitor current for current measuring purposes, as well as to assist in determining real and reactive power, and to drive watt hour meters.

In some situations, a DC level is imposed on the primary winding of the current transformer. For example, half wave rectifiers are sometimes connected directly in the primary winding in attempts to defeat the accuracy of the current measurement. In other instances, DC rectification loads are connected to the line and coupled to the current transformer primary winding.

The DC level in the primary winding biases the high permeability magnetic core in one direction, so that the core has a tendency to become saturated to a greater extent during half cycles of one polarity than during half cycles of the other polarity. Even if the core is not driven into saturation during half cycles of either polarity, the amplitude of the voltage induced in the secondary winding differs during opposite polarity half cycles with a core having a DC bias superimposed thereon.

I am aware of two different prior techniques for detecting the asymmetric responses during opposite polarity half cycles of a current transformer secondary winding having a primary winding subjected to a DC level. In the first technique, referred to as differential peak detection, a derived control signal has an amplitude dependent upon the difference in positive and negative peaks of the secondary current. In the second, zero crossing detection technique, the control signal has an amplitude dependent upon the differential duration of the positive and negative half cycles of a replica of the current in the secondary winding. The control signal is derived as a DC voltage which is applied to a compensating winding wound on the current transformer. Ideally, the DC current applied to the compensating winding tends to restore the DC magnetic flux of the transformer core to the same level it would have had if no DC were imposed on the primary winding of the transformer.

The differential peak detection technique, as exemplified by Milkovic, U.S. Pat. No. 4,255,705, is not always effective because transient effects in the transformer affect the core magnetizing inductance. If, e.g., a positive half wave rectified current is applied to the current transformer, the secondary voltage has positive and negative peaks with similar magnitudes. The magnitudes are about the same because the primary winding half wave rectified positive current is converted into an AC secondary voltage waveform having a first segment that resembles a half wave rectified sine wave and a second segment including a negative peak followed by an exponential ramp. When the primary winding current initially goes positive at the beginning of a positive sinusoidal half cycle of the rectified current, the secondary winding output voltage is negative. The secondary voltage then increases to a positive peak value, which occurs approximately simultaneously with the peak value of the primary winding current. In response to the primary winding current returning to zero, the secondary winding voltage drops suddenly to a negative peak value which is approximately equal to the secondary positive peak value. The exponential ramp of the second segment then is derived until the primary winding starts to go through another sinusoidal half cycle. The first and second segments occur while the primary half wave rectified current has finite and zero values, respectively.

The differential peak detection technique is subject to significant errors because the positive and negative peak values have approximately the same amplitude for the frequently encountered situation of a half wave rectified sine wave current applied to the current transformer. Very large percentage errors occur when two values having approximately the same amplitude are compared. Hence, the differential peak detection technique is subject to inaccuracies which cannot be tolerated in a high probability situation.

The zero crossing detection technique is subject to inaccuracies if the amplitudes of a sinusoidal waveform and a half wave rectified sinusoidal waveform simultaneously applied to the primary winding are approximately the same. If, e.g., a sinusoidal waveform having the same amplitude as a half wave rectified waveform is applied to the current transformer primary, the difference in zero crossing periods of the half secondary winding current is reduced approximately by a factor of two.

DISCLOSURE OF INVENTION

In accordance with one aspect of the present invention, DC magnetic flux bias imposed on a magnetic core of a current transformer is compensated in response to an indication of the amplitude and duration of opposite polarity secondary winding current components. The net DC magnetic flux supplied to the core is controlled in response to the indication to overcome the tendency of the core to be biased away from the zero flux position. The compensation is employed in combination with measuring apparatus responsive to the magnitude of the AC current in the secondary winding. Such monitoring apparatus may be a current measuring meter, a real or reactive watt meter, or a watt hour meter. The indication of the different DC amplitudes and different time durations is preferably derived by comparing the average values of the positive and negative current components relative to positive and negative DC offset values to derive an error indication.

In accordance with another embodiment of the invention, the magnetic bias effect on the core resulting from the primary winding DC current is compensated by responding to the integral of the secondary current. The integral of the secondary current is a measure of the magnetic core flux variations. The durations of the positive and negative flux variations are compared. This technique avoids the previously mentioned problem associated with comparing the durations of the positive and negative secondary current variations.

In both embodiments of the present invention, a control signal is derived for a DC current applied to a compensating winding of the transformer core. In the first embodiment, the control signal has a magnitude proportional to the relative time duration and amplitude of the positive and negative half cycles. In the second embodiment, the control signal has a magnitude proportional to the relative durations of the positive and negative half cycles of the magnetic flux in the core.

While both embodiments of the present invention function satisfactorily under certain operating conditions, the first embodiment is believed to have more universal applications. If an inductor is connected in series with the primary winding of the second embodiment, the control signal applied to the compensating winding does not return the bias point of the core to a zero DC magnetic flux level on a B-H hysteresis curve.

It is, accordingly, an object of the present invention to provide a new and improved apparatus for and method of compensating for DC bias introduced into a magnetic core responsive to a primary winding current having AC and significant DC components.

It is another object of the present invention to provide a new and improved apparatus for and method of more accurately providing an indication of AC current flowing in a primary winding of a current transformer having a magnetic core that is DC biased in response to a DC component superimposed on the AC component in the transformer core primary winding.

Another object of the present invention is to provide a new and improved method of and apparatus for compensating for magnetic core DC offset introduced by a half wave rectified AC current in a primary winding of a current transformer which causes positive and negative current components of the transformer secondary winding to be approximately equal.

A further object of the present invention is to provide a new and improved apparatus for and method of compensating DC bias offset introduced by half wave rectified currents flowing in a primary winding of the transformer wherein the amplitudes of the resulting AC and DC components are approximately the same.

The above and still further objects, features and advantages of the present invention will become apparent upon consideration of the following detailed description of several specific embodiments thereof, especially when taken in conjunction with the accompanying drawing.

BEST MODE FOR CARRYING OUT THE INVENTION

Figure 1:
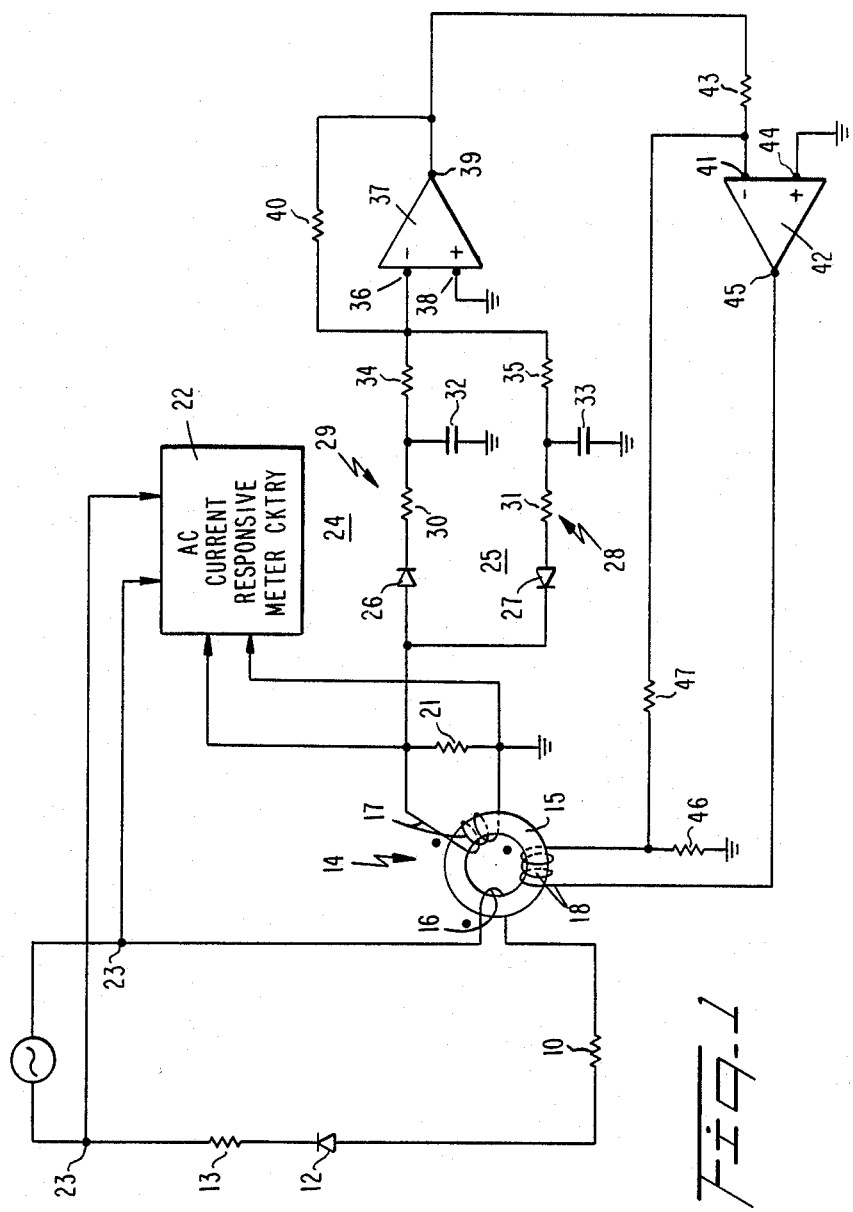
FIG. 1 is a circuit diagram of a first preferred embodiment of the invention.

Reference is now made to FIG. 1 of the drawing wherein a preferred embodiment of the present invention is illustrated in combination with AC power line 11, such as a 120 volt, 60 Hz power line. Power line 11 is connected to a half wave rectifier including diode 12 and resistor 13, both series connected with the line. The half wave rectifier is connected to line 11 by a customer using the line or is part of an impedance load on the line. In any event, the half wave rectifier causes the current flowing in line 11 to be transformed from the usual sinusoidal waveform to a half wave rectified waveform, including positive sinusoidal-like half cycles having a single polarity, separated by zero valued half cycles. The half wave rectified sine wave includes a substantial DC component, as well as a fundamental component at the power line frequency and harmonics of the fundamental.

To derive a signal having a magnitude directly proportional to the AC current components in power line 11, the power line forms a primary winding of current transformer 14 including high magnetic permeability magnetic core 15. Typically, power line 11 may be looped as a single turn 16 through core 15. For many practical situations wherein a consumer is supplied with a so-called two phase, three wire power line, a line from each phase is looped through the magnetic core. To simplify the exposition, only a single phase AC line is described in connection with FIG. 1.

Transformer 14 includes multi-turn secondary winding 17 and auxillary, multi-turn winding 18, both wound on magnetic core 15. Typically, windings 17 and 18 have an equal number of turns, such as 1000, and the winding directions of the turns are as indicated in FIG. 1 by the dot convention so that the polarities of the voltages across turns 16 and 17 are the same and oppositely directed magnetic fluxes are introduced by windings 16 and 18 in core 15.

Shunting winding 17 is burden or load resistor 21, having opposite terminals connected to opposite polarity input terminals of AC current responsive meter circuit 22; one terminal of resistor 21 is grounded. Circuit 22 is typically an electronic watt hour meter responsive to the AC current in secondary winding 17 and the magnitude of the AC voltage across terminals 23 of AC line 11. Alternatively, circuit 22 responds to the voltages across resistor 21 and terminals 23 to derive an indication of the instantaneous real or reactive power supplied by the AC line to load 10, or is responsive only to the current flowihg in line 11. The impedances of resistor 21 and circuit 22 are such that they insignificantly load winding 16 and the voltage across the resistor is a replica of the current flowing in winding 17.

The DC component of the current in line 11 displaces the quiscent operating point of core 15 from the normal zero flux value on the B-H hysteresis curve of the core. The DC current flowing in line 11 and winding 16 causes core 15 to be biased in a positive or negative direction. The DC magnetic bias of core 15 causes the AC voltage induced in winding 17 to have asymmetrical opposite polarity half cycles. The asymmetry of the opposite polarity half cycles is applicable to the amplitude and duration of the current in secondary winding 17 for the opposite polarity half cycles.

In certain situations, the amplitude of the current in line 11 is sufficiently great to cause core 15 to be saturated during opposite polarity half cycles of the current in line 11. The DC bias imposed by the half wave rectifier on the current in line 11 is such that the degree of saturation for one polarity half cycle is greater than the degree of saturation during the other half cycle.

Even if core 15 is not saturated, the amplitude and duration of the current in secondary winding 17 differ as a result of the DC flux bias. The embodiment of FIG.

1 relies upon the difference in the duration and amplitude of the opposite polarity half cycles to derive a correction signal having a magnitude sufficient to overcome the bias effects introduced by the DC current component in winding 16. The correction signal determines the amplitude of a DC current applied to auxillary winding 18. The level of the DC current applied to winding 18 is controlled to provide the desired compensation.

To provide a measure of the difference in amplitude and duration of the opposite polarity half cycles in secondary winding 17, the voltage across burden resistor 21 is applied to positive and negative detecting channels 24 and 25. Detecting channels 24 and 25 are respectively responsive to the positive and negative voltages developed across burden resistor 21. To these ends, channels 24 and 25 include silicon diodes 26 and 27, respectively having an anode and cathode connected to the ungrounded terminal of resistor 21. The cathode of diode 26 and the anode of diode 27 are respectively connected to low pass or averaging circuits 28 and 29. Circuits 28 and 29 respectively include series resistors 30, 31 and shunt capacitors 32, 33. The values of resistors 30, 31 and capacitors 32, 33 are selected so the time constants of averaging circuits 28 and 29 are considerably in excess of one cycle (more than ten times) of the fundamental of the AC current flowing in line 11.

The voltages across capacitors 32, 33 respectively represent the amplitudes and durations of the positive and negative voltage components developed across burden resistor 21. During positive half cycles of the current flowing in winding 17, current flows through diode 26 to capacitor 32 when the voltage across resistor 21 is greater than the sum of the 0.6 volt drop across diode 26 and the voltage across capacitor 32. During negative half cycles of the current flowing in winding 17, capacitor 33 is charged in response to current flowing through diode 27 when the 0.6 volt drop across the diode and the voltage across capacitor 33 exceeds the voltage across winding 17.

The voltages developed across capacitors 32, 33 are constantly discharged. Capacitors 32, 33 are connected by resistors 34, 35 to inverting input terminal 36 of DC operational, summing amplifier 37, having grounded non-inverting input terminal 38. Connected between output terminal 39 and inverting input terminal 36 of amplifier 37 is feedback resistor 40. Amplifier 37 and the circuitry associated therewith cause inverting input terminal 36 of the amplifier to be at virtual ground potential. Current continuously flows from capacitors 32, 33 through resistors 34, 35 to the virtual ground potential at inverting input terminal 36. The extent of current flow through resistors 34, 35 is sufficiently great to cause current to flow through diodes 26 and 27 during each positive and negative half cycle of the AC voltage across winding 17.

Figure 2:
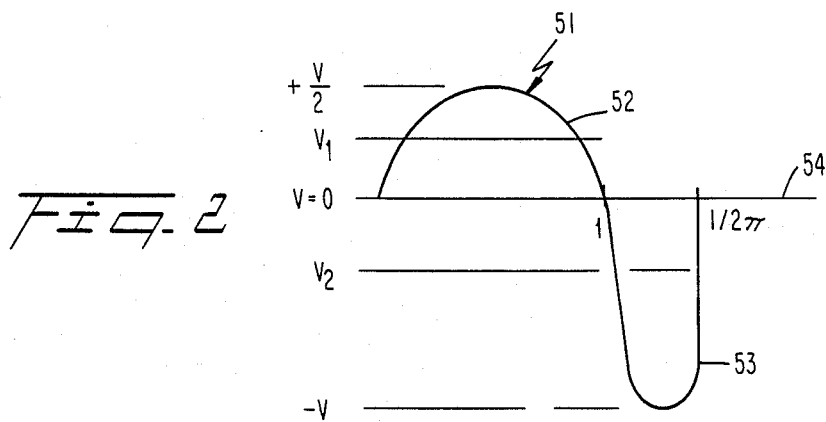
FIGS. 2 3a & b are waveforms useful for describing the operation of the circuit of FIG. 1.

As described in greater detail infra, with reference to FIG. 2, amplifier 37 generates a DC voltage at terminal 39 which provides a measure of the differential amplitude and duration of opposite polarity half cycles of the AC current induced in secondary winding 17. If line 11 only conducts AC current, there is a zero DC voltage derived at terminal 39. By connecting diode 12 and resistor 13 in line 11 in the manner indicated, the voltage derived at terminal 39 has an amplitude and polarity indicative of the difference in amplitude and duration of the positive half cycles of the AC current induced in winding 17 in response to the half wave rectified current in winding 16.

The DC control signal at output terminal 39 of amplifier 37 is applied to inverting input terminal 41 of DC current driver or amplifier 42 by way of coupling resistor 43. Driver 42 includes grounded non-inverting inprt terminal 44 and output terminal 45, connected to one end of winding 18. The other end of winding 18 is connected to shunt resistor 46 and to feedback resistor 47, connected to inverting input terminal 41. The value of resistor 46, which controls the amount of current flowing in winding 18, is selected so that the proper current flows in winding 18 to provide the desired compensation flux for core 15.

The current flowing through winding 18, as determined by the output of amplifier 42 and the values of resistors 46 and 47 as well as the number of turns in windings 16 and 18 is such that the number of ampere turns supplied by winding 18 to core 15 is equal to the number of ampere turns supplied to the cor by winding 16. Since the DC fluxes coupled by windings 16 and 18 to core 15 by windings 16 and 18 are equal and the direction of current flow in the windings is opposite to each other the DC magnetic flux coupled to the core 15 by winding 16 is cancelled by the DC magnetic flux coupled to the core by winding 18. Thereby, by proper selection of resistor 46 the circuit of the present invention can be used with many different magnetic cores, while maintaining the number of turns in windings 17 and 18 the same for different types of cores.

The current flowing in auxillary winding 18 controls the magnetic flux in core 15 to tend to center the operating point of the magnetic core at the zero flux value. Hence, the product of current and time during which current flows to capacitor 32 during the positive half cycles of the voltage across resistor 21 has a tendency to equal the product of current and time during which current flows to capacitor 33 during the negative half cycles of the current flowing through resistor 21. Because (1) capacitors 32, 33 have the same values, (2) charging resistors 30, 31 have the same value, (3) the capacitors are connected through equal valued discharge resistors 34, 35 to virtual ground and (4) diodes 26 and 27 have virtually the same voltage drop and impedance when conducting, the voltages across capacitors 31 of networks 28 and 29 indicate the duration of the time while the opposite polarity voltages exceed the diode drops and the maximum amplitudes of the voltages during the opposite polarity half cycles.

Amplifier 37 responds to the polarity of the voltage applied to inverting input terminal 36 to derive a variable level, bi-polarity output voltage which controls the amplitude and polarity of the current supplied by driver 42 to winding 18. Hence, for example, if the voltage across capacitor 33 exceeds the voltage across capacitor 32, amplifier 37 derives a positive DC voltage which causes a negative current to flow from output terminal 45 of driver 42 to winding 8. In contrast, if the magnitude of the voltage across capacitor 32 exceeds the magnitude of the voltage across capacitor 33 a net positive voltage is applied to the non-inverting input terminal of amplifier 37, causing a positive current to be supplied by driver 42 to winding 18.

To assist in understanding the operation of the present invention, consider waveform 51, FIG. 2. Waveform 51 represents the AC voltage generated across resistor 21, assuming that the current flowing in line 11 has a DC component superimposed on an AC sinusoid.

Hence, the situation illustrated by waveform 51 is not representative of the half wave current which flows in line 11 if diode 12 and and resistor 13 are connected in series with load 10. Instead, waveform 51 represents some other, perhaps theoretical, combination of AC and DC currents in line 11.

In the hypothetical situation illustrated in FIG. 2, waveform 51 includes a positive sinusoidal half cycle 52 having a relatively low amplitude of +V/2, followed by a relatively large amplitude negative sinusoidal half cycle having a peak amplitude of −V. The positive and negative half cycles respectively have durations of 1 and $\pi/2$. Thereby, positive and negative half cycles 52 and 53 have equal areas and average values relative to zero voltage level 54. The voltage developed across resistor 21 is a replica of the current flowing in winding 17.

The circuit illustrated in FIG. 1 responds to waveform 51 so that the area above voltage level $V_1$ during the positive half cycle tends to equal the area below level $V_2$ during the negative half cycles. The area of waveform 51 above level $V_1$ represents the DC voltage across capacitor 32, while the area of waveform 51 below level $V_2$ represents the DC voltage across capacitor 33. If the areas of waveforms 52 and 53 respectively above and below levels $V_1$ and $V_2$ are not equal driver 42 supplies winding 18 with a DC current having an amplitude and polarity controlled by the summed voltage at the inverting input terminal 36 of amplifier 37. In the steady state condition, the amplitude of the current supplied by amplifier 42 to winding 18 is constant because of the long time constants of the charge and discharge circuits for capacitors 32, 33 relative to the period of the fundamental frequency of the AC current on line 11. When the equilibrium condition is reached, the voltages on capacitors 32, 33 are constant at the levels indicated by $V_1$ and $V_2$, so that in the exemplary situation illustrated in FIG. 2, the magnitude of the negative voltage on capacitor 33 exceeds the magnitude of the positive voltage on capacitor 32.

Figure 3A:
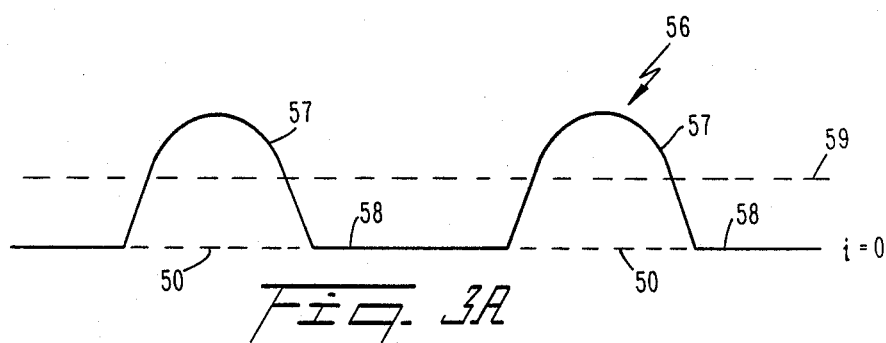

Consideration is now given to the nature of the operation of the circuit assuming that a half wave rectified current flows in line 11, as illustrated in FIG. 3a. Waveform 56, FIG. 3a, includes positive sinusoidal half cycle humps 57 separated by zero current level segments 58, each having a duration equal to one half cycle of the AC line current fundamental. Hence, waveform 56 has a finite positive average value 59 having a value between zero and the peak value of each positive half cycle hump 57 such that the area beneath line 59 enclosed by line 50 and the sides of hump 57 connected to the line equals the area enclosed by hump 57 above line 59.

Figure 3B:
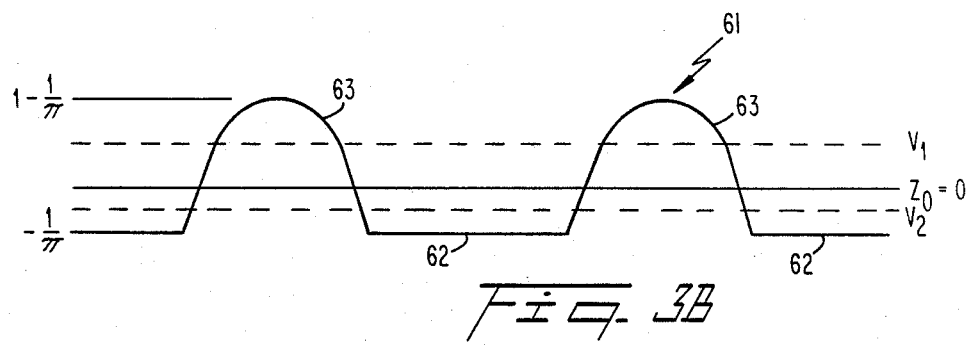

For the purposes of the present exposition, it is assumed that the half wave rectified waveform 56 is replicated, with a shift in DC level, by transformer 14, so that the waveshape of the current flowing in secondary winding 17 is illustrated in FIG. 3b. Waveform 61 includes constant amplitude segments 62 and half wave sinusoidal segments 63; segments 62 and 63 have equal durations. Waveform 61 has a zero average value so that the value of zero current in secondary winding 17 is displaced from wave segment 62 by an amount equal to the displacement between wave segments 58 and average value 59, FIG. 3a. The peak values of sinusoidal segments 62 and 63 are respectively equal to $(-1/\pi)$ and $(1-1/\pi)$. Hence, the mathematical relationship for waveform 61 is expressed as:

$$f(x) = \sin x - \frac{1}{\pi} \ (0 < x < \pi)$$

$$f(x) = -\frac{1}{\pi} \ (\pi < x < 2\pi).$$

The circuit of FIG. 1 responds to waveform 61 to control the current supplied to winding 18 so that the area of waveform 61 below level $V_2$ is equal to the area of waveform 61 above level $V_1$. The voltage on capacitor 32 is directly proportional to the charge accumulated on capacitor 32 during each positive half cycle of the current flowing out of winding 17 minus the DC current supplied by capacitor 32 to the virtual ground at terminal 36, while the voltage on capacitor 33 is directly proportional to the charge accumulated by capacitor 33 during each negative half cycle of current flowing out of winding 17 minus the DC current supplied by capacitor 33 to terminal 36. The charges accumulated by capacitors 32 and 33 are directly proportional to the area of waveform segments 63 above and below levels $V_1$ and $V_2$, respectively. Diodes 26 and 27 only conduct current to capacitors 32 and 33 during the intervals while waveform 61 has values above and below levels $V_1$ and $V_2$, respectively. Levels $V_1$ and $V_2$ are determined by (1) the forward voltage drops of diodes 26 and 27, (2) the magnitude of the current flowing in winding 17, -and (3) the component values of resistors 30, 31, 34 and 35 as well as capacitors 32 and 33. Diode 26 only conducts during that portion of the half cycle when the voltage across resistor 21, which is an exact replica of current waveform 61, exceeds the voltage across capacitor 32 during each positive half cycle of waveform 61. Similarly, diode 27 only conducts current when the negative voltage across resistor 21 exceeds the magnitude of the negative voltage across capacitor 33.

In equilibrium, the charge which flows into capacitor 32 by way of resistor 30 is equal to the charge which flows out of the capacitor through discharge resistor 34 to the virtual ground at inverting input terminal 36 during each cycle of the AC current flowing in winding 17. It can be shown that the charge flowing into capacitor 32 during each positive half cycle is equal to:

$$\frac{2}{R_1}\left[\int_{\alpha}^{\frac{\pi}{2}}\left(\sin t - \frac{1}{\pi}\right)dt - V_1\left[\frac{\pi}{2} - \alpha\right]\right] = \frac{2\pi V_1}{R_2} g. \quad \text{(Equation 1)}$$

where $\alpha$ is equal to the angle, in radians, at which waveform segment 63 initially exceeds level $V_1$, and $t = $ time. The charge flowing out of capacitor 32 can be represented as:

$$\frac{2\pi V_1}{R_2} \quad \text{(Equation 2)}$$

where $R_2$ is the value of resistor 34. By equating Equations 1 and 2, the value of $V_1$ can be determined from $$V_1 \approx \frac{\frac{1}{\pi}\left(\alpha - \frac{\pi}{2}\right) + \cos\alpha}{\pi \frac{R_1}{R_2} - \left(\alpha - \frac{\pi}{2}\right)}, \quad \text{(Equation 3)}$$

where $\alpha = \arcsin(V_1 + 1/\pi)$, and $R_1$ equals the value of resistor 30. Equation 3 can be solved with a computer using iterative methods.

The value of $V_2$ can be determined using similar techniques as:

$$V_2 \approx \frac{-(\pi + \beta)}{\pi\left(2\pi \frac{R_1}{R_2} + \pi + \beta\right)}, \quad \text{(Equation 4)}$$

assuming that the values of resistors 30 and 31 are the same and the values of resistors 34 and 35 are the. same, and $\beta = \arcsin(-V_2 + 1/\pi)$. Again, Equation 4 can be solved using computer iterative methods.

The sum $(V_1 + V_2)$ does not equal zero even though waveform 61 has a zero average value. This is because both the amplitude and duration of the AC secondary current control the voltages across capacitors 32 and 33. The values of $V_1$ and $V_2$ reflect both the amplitude and the conducting duration of the current flowing through diodes 26 and 27. If an additive sinusoid is superimposed on the half wave rectified current flowing in line 11 the sum of the voltages across capacitors 32 and 33, which represent the values of $V_1$ and $V_2$, is unchanged since the operation of the circuit of FIG. 1 is linear and the superposition theorem is applicable.

The effects of real diodes 26 and 27 in the circuit of FIG. 1 are symmetrical, provided that the amplitudes of the positive and negative going portions of the voltage across resistor 21 exceed approximately 0.5 volts. Below the 0.5 volt level the compensating portion of the circuit illustrated in FIG. 1 is inoperative. However, at theee low levels the corresponding low levels of DC in primary winding 16 are not detrimental to the operation of AC current responsive meter circuitry 22.

The compensating method and apparatus disclosed in connection with FIGS. 1-3 is an open-loop method since there is no change in the DC sensing circuit output at terminal 39 when the circuit is operating. The only way to determine that the correction is being provided is to observe the output waveform across resistor 21 with and without winding 18 connected to be responsive to the output of amplifier 42. In tests conducted with the present invention, it has been found that the DC bias imposed on core 15 is perfectly compensated and has a waveshape including a segment that is an exact replica of a hump of a half wave rectified waveform, followed by an exponentially increasing segment having the same duration as the half cycle of the sinusoid. If there is no compensation in accordance with the present invention, the waveshape across resistor 21 includes appreciable distortion during the half cycle while rectification is taking place in line 11, particularly during the second half of the sinusoidal hump.

According to a second embodiment of the invention, compensation for the DC flux level of magnetic core 15 is pprovided by sensing the polarity durations of the positive and negative flux variations in the core. Because core 15 is asymmetrically biased by the DC current in winding 16, the flux variations in the core are not a replica of the current induced in winding 17. This is because the current in winding 17 is directly proportional to the time rate of change of flux in core 15. Because a DC level is imposed by the current in winding 16 on the magnetic flux of core 15 the large amplitude sinusoidal components in winding 16 are not accurately reproduced as sinusoidal currents in winding 17.

By comparing the time durations of the positive and negative flux variations in core 15, rather than the positive and negative current durations or the positive and negative amplitude durations, as described in the aforementioned patents, greater accuracy is provided. It has been found that the current flowing in secondary winding 17 is almost amplitude and duration symmetrical for the positive and negative half cycles even though core 15 exhibits partial saturation in one polarity direction. The slight duration and amplitude asymmetries, when compared, result in relatively large error signals that tend to prevet accurate circuit operation. To provide a replica of the magnetic flux variations in core 15 the integral of the current in winding 17 is derived. The relative time durations of the positive and negative half cycles of the integral of the current is derived to control the amplitude of an erro signal supplied to amplifier 42.

Figure 4:
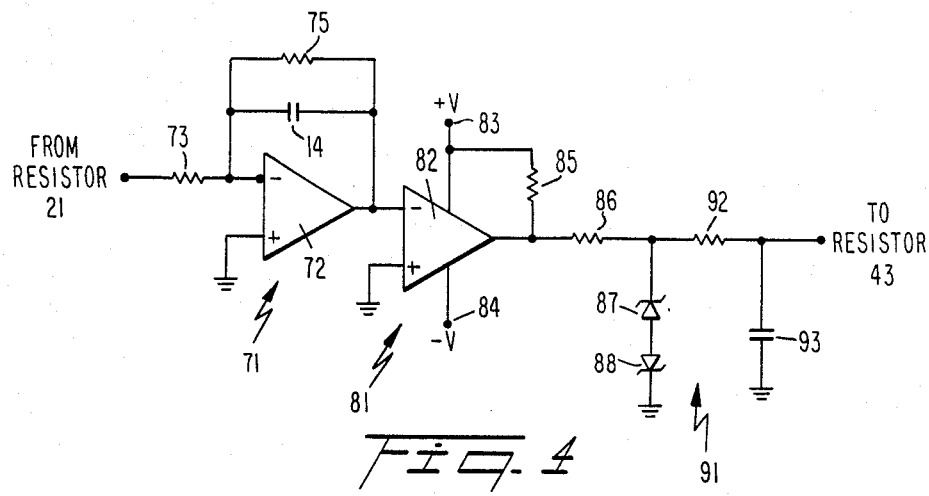
FIG. 4 is a circuit diagram of a second embodiment of the invention.

One particular circuit for controlling the amplitude and magnitude of the DC current supplied by amplifier 42 to winding 18, as a function of the relative time durations of the flux variations in core 15, is illustrated in FIG. 4. The circuit of FIG. 4 replaces the control circuit of FIG. 1 between the output terminals across burden resistor 21 to output terminal 39 of operational amplifier 37. The only other change is that the connections between output terminal 45 of current driver 42 and the terminals of winding 18 are reversed when the circuit of FIG. 4 is used.

The circuit of FIG. 4 includes integrator 71, containing DC operational amplifier 72 having an inverting input terminal connected to burden resistor 1 by input or coupling resistor 73. Amplifier 72 includes a grounded non-inverting input terminal and an output terminal, connected to a feedback network including integrating capacitor 74 and shunt resistor 5, that stabilizes the amplifier. While resistor 75 prevents integrator 71 from operating as a perfect integrator, operation of the circuit does not seem to be impaired. The input impedance of integrator 71, as coupled to burden resistor 21, must be relatively high so that the metering circuit does not draw appreciable current from the monitored power line.

Figure 5A:
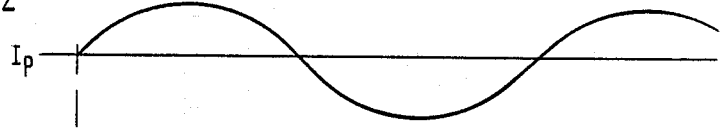
FIGS. 5a–5d are waveforms useful in describing the operation of the circuit illustrated in FIG. 4.

Integrator 71 responds to the AC current in winding 17 to derive an output signal having a waveform that is a replica of the flux variations of core 15. A better understanding of the nature of the waveform derived at the output of integrator 71 can be obtained by reference to the waveforms of FIGS. 5a–5d, assuming that a DC magnetic flux bias is applied to core 15 and a sinusoidal voltage, as illustrated in FIG. 5a, is applied to primary winding 16. The sinusoidal current applied to winding 16 causes the intensity of the AC magnetic field ($H = NI$, where $N =$ the number of turns of winding 16, and $I =$ AC current applied to winding 16) of the core to vary somewhat sinusoidally at a phase displaced 90 degrees from the phase of the current flowing in winding 16. The magnetic intensity variations in core 15 due to the current flow in winding 16 are indicated by the cosinusoidal-like wave illustrated in FIG. 5b.

Figure 5B:
Figure 5C:
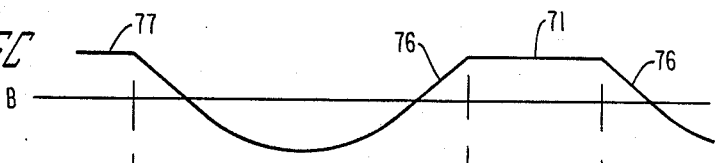

The magnetic intensity variations represented by the cosine-like wave of FIG. 5b cause the magnetic flux density ($B = \mu H$) of core 15 to vary as illustrated in FIG. 5c. The waveform of FIG. 5c includes sinusoidal segments 76 and constant amplitude segments 77. Sinusoidal segments 76 have the same waveshape as the magnetic intensity variations of FIG. 5b when core 15 is not saturated. When core 15 is saturated, however, the magnetic flux density in core 15 is constant, as illustrated by waveform segments 77.

Figure 5D:
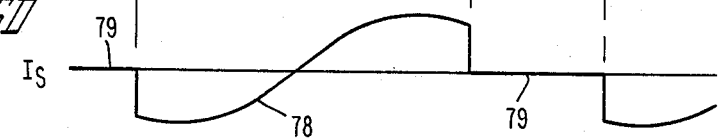

The current induced in secondary winding 17 in response to the magnetic flux density variations of FIG. 5c is illustrated in FIG. 5d. The waveform of FIG. 5d is proportional to the derivative of the waveform illustrated in FIG. 5c since $I_s = KdB/dt$. While the magnetic flux density undergoes sinusoidal variations, as indicated by waveform segment 76, the current induced in winding 17 undergoes phase displaced sinusoidal variations, as illustrated by waveform segment 78. The current in secondary winding 17 has a zero value while the magnetic flux in core 15 is constant at the time the core is saturated. This is indicated in FIG. 5d by waveform segments 79 which are time coincident with waveform segments 77.

An analysis of FIGS. 5c and 5d indicates that the peak amplitude of the current induced in winding 17 is the same for the positive and negative half cycles of the waveform illustrated in FIG. 5d. In addition, the relative times while waveform segment 78 is above and below the zero value for the secondary current are the same. Hence, the prior art techniques utilizing differential peak current amplitudes for opposite polarity variations and comparing the time durations of the opposite polarity current segments are not accurate for the situation illustrated in connection with FIGS. 5a-5d.

In accordance with the second embodiment of the invention, as illustrated in FIG. 4, advantage is taken of the relative times during which the waveform of FIG. 5c is above and below the zero magnetic flux density 3ne of FIG. 5c. The output of integrator 71, as illustrated in FIG. 5c, has a waveshape that represents the magnetic flux density for the exemplary situation depicted in FIGS. 5a-5d. The time while the waveform of FIG. 5c has a value less than $B = 0$ is considerably less than the time while the waveform has a value greater than $B = 0$. The circuitry illustrated in the remainder of FIG. 4 basically determines the relative intervals of the periods when the waveform of FIG. 5c is greater than $B = 0$ and less than $B = 0$ and derives an indication of the difference.

To these ends, the magnetic core flux density representing output signal of integrator 71 is applied to amplitude comparator 81, including high gain operational amplifier 82 having an inverting input terminal connected to the output of operational amplifier 72. Amplifier 82 includes a grounded non-inverting input terminal and an output terminal on which is derived a bi-level voltage. Opposite polarity reference voltages are applied to amplifier 82 by DC sources at terminals 83 and 84. The output terminal of amplifier 82 is connected via resistor 85 to the positive reference voltage at terminal 83.

Amplitude comparator 81 responds to the output signal of integrator 71 to derive a bi-level signal having positive and negative equal amplitude values, with zero crossings synchronized with the zero crossings at the output of amplifier 71. In response to the output of amplifier 71 going from a negative to a positive polarity, the output of comparator 81 changes from $+V$ to $-V$. The output of comparator 81 remains at the $-V$ level until there is a polarity transition from plus to minus at the output of integrator 81, at which time the output of comparator 81 abruptly switches from $-V$ to $+V$.

A voltage regulating circuit including series resistor 86 and a shunt branch containing series connected back-to-back zener diodes 87 and 88 is connected to the output terminal of operational amplifier 82 to control more precisely the amplitudes of the positive and negative transitions at the output of the amplifier. Thereby, there is derived across zener diodes 87 and 88 a bi-polarity voltage having constant positive and negative amplitudes with transitions precisely synchronized with polarity transitions at the output of integrator 71. By utilizing back-to-back zener diodes 87 and 88 it is not necessary to have the positive and negative voltages at terminals 83 and 84 balanced or to be overly concerned about the collector-to-emitter saturation voltage of an output transistor in comparator 82.

The bi-level output developed across zener diodes 87 and 88 is coupled to averaging network 91, which includes series resistor 92 and shunt capacitor 93. The values of resistor 92 and capacitor 93 are selected so that the time constant of circuit 91 is many times (e.g. 10 or more) greater than the fundamental frequency of the output waveform of integrator 71. There is developed across capacitor 93 a DC voltage having a magnitude directly proportional to the difference in time durations of the positive half cycle variations of the magnetic flux in core 15 relative to the negative half cycles of the magnetic flux variations in the core. The voltage across capacitor 93 is supplied to resistor 43 to control the magnitude and polarity of the DC current supplied by current driver 42 to winding 18. The magnetic flux induced in winding 18 substantially cancels the DC magnetic flux coupled to core 15 by winding 16.

The gain of operational amplifier 82 is relatively low, such as 100 milliamps per volt, for two reasons. In particular, the DC compensation technique of the invention is not exact for certain waveshapes coupled to winding 16; typical of the waveshapes for which inexact compensation occurs is a wave that is a sinusoid for one quarter of a cycle and which then drops to a zero value until a later zero crossing occurs in the waveshape applied to winding 16. At the later zero crossing, the quarter cycle sinusoidal waveshape is repeated, either in the same or in the opposite direction as in the previous quarter cycle. In this situation the DC magnetic flux in core 15 is compensated to zero when the zero crossing periods are within a few percent of being equal. If amplifier 42 had high gain, winding 18 would be over driven with possible deleterious effects. The gain of amplifier 82 should also be relatively low so that a small amount of DC magnetic flux in core 15 does not substantially affect the performance of the core. If the DC current in winding 16 is relatively low no adverse effects are reflected in the current supplied by winding 17 to meter circuit 22. The present invention is designed to compensate for large DC input currents to winding 16, to provide compensation for many DC ampere turns introduced by the current in winding 16 on core 15.

While there have been described and illustrated several specific embodiments of the invention, it will be clear that variations in the details of the embodiments specifically illustrated and described may be made without departing from the true spirit and scope of the invention as defined in the appended claims.

I claim:

1. Apparatus for compensating for DC current flowing in a primary winding of a transformer having a secondary winding and a magnetic core with a B-H curve, the DC current having a tendency to supply DC magnetic flux to the core to bias the core so as operating point thereof is displaced from a zero flux position on the B-H curve thereby to cause positive and negative current components in the secondary winding to have different amplitudes and different time durations, the apparatus comprising means responsive to the positive and negative current components for deriving a first signal having a value determined by the average values of the positive current components, a second signal having a value determined by the average values of the negative current components, and a third signal having a value determined by a comparison of the amplitudes of the first and second values to indicate the average values of the positive and negative components, and means for controlling the DC magnetic flux supplied to said core in response to the third signal to overcome the tendency of the core to be biased away from the zero flux position.

2. The apparatus of claim 1 wherein the means for controlling includes: winding means coupled to the magnetic core, and means for deriving a DC current having an amplitude directly proportional to the magnitude of the third signal, the third signal being supplied to the winding means.

3. The apparatus of claim 2 wherein the signal derving means includes means responsive to the positive and negative components for comparing the average values of the positive and negative components relative to positive and negative DC offset values therefor to derive an error signal having a magnitude indicative of the relative value of the average values, the DC flux being controlled by the magnitude of the third signal.

4. The apparatus of claim 1 wherein the primary winding is responsive to AC current, the means for controlling including an auxiliary winding on the core, the deriving means including first and second capacitors, a constant impedance discharge network connected to each of the capacitors so that charge is continually removed from the capacitors, first and second variable impedance charging networks respectively connected to the first and second capacitors, the first variable impedance charging network including first variable impedance means for supplying current indicative of current flowing in the secondary winding to the first capacitor in response to the secondary winding voltage magnitude of the voltage across the first capacitor while the secondary winding voltage has a first polarity and while the secondary winding voltage magnitude is greater than voltage across the first capacitor, the impedance of the first variable impedance means varying while current is supplied to the first capacitor, the first charging network being arranged so the voltage developed across the first capacitor has a value commensurate with the average value of the current flowing in the first variable impedance means, the second variable impedance charging network including second variable impedance means for supplying current indicative of current flowing in the secondary winding to the second capacitor in response to the secondary winding voltage magnitude being greater by the predetermined value than the magnitude of the voltage across the second capacitor while the secondary winding voltage has a second polarity and while the secondary winding voltage magnitude is greater that voltage across the second capacitor, the impedance of the second variable impedance means varying while current is supplied to the second capacitor, the second charging network being arranged so the voltage developed across the second capacitor has a value commensurate with the average value of the current flowing in the second variable impedance means; the values of components in the first and second charging networks the discharge network and the capacitors being such that DC voltages developed across the capacitors are substantially constant during steady state operation of the transformer in response to the AC current; and means for linearly combining signals indicative of the magnitude of the voltages across the first and second capacitors to derive the third signal, the third signal having an amplitude and polarity respectively indicative of the level and polarity of DC magnetic flux bias in the core.

5. The apparatus of claim 4 wherein the means for linearly combining includes an operational amplifier having a virtual ground potential input terminal responsive to discharge currents flowing from the first and second capacitors through the discharge network, first and second resistors respectively conencted between the first and second capacitors and said input terminals, the resistors and capacitors having values to cause, in steady state operation, discharge of the first capacitor during each cycle of the AC current by the same amount as the first capacitor is charged during each cycle of the AC current and discharge of the second capacitor during each cycle of the AC current by the same amount as the second capacitor is charge during each cycle of the AC current.

6. The apparatus of claim 4 wherein the first and second variable impedance means respectively include first and second silicon diodes poled to pass opposite polarity currents to the first and second capacitors.

7. The apparatus of claim 6 wherein the first and second diodes are respectively connected in series with: the secondary winding and the first and second capacitors, the first and second capacitors being connected in shunt to be responsive to the currents respectively flowing from the secondary winding to the first and second charging circuits and to supply current to the discharge network.

8. The apparatus of claim 1 wherein the apparatus is in combination with a means for derving an indication of AC current flowing in a line subject to a DC current component, circuit meter means responsive to the amplitude of AC current in the secondary for deriving an indication of the line current, the apparatus for compensating for the magnetic DC bias of the core being arranged so that AC current in the secondary winding accurately represents the line current and the meter means derives an accurate indication of the AC line current, the compensating apparatus including: first and second capacitors, a constant impedance discharge network connected to each of the capacitors so that charge is continually removed from the capacitors, first and second variable impedance charging networks respectively connected to the first and second capacitors, the first variable impedance charging network including first variable impedance means for supplying current indicative of current flowing in the secondary winding to the first capacitor in response to the secondary winding voltage magnitude being greater by a predetermined value than the magnitude of the voltage across the first capacitor while the secondary winding voltage has a first polarity and while the secondary winding voltage magnitude is greater than voltage across the first capacitor, the impedance of the first variable impedance means varying while current is supplied to the first capacitor, the first charging network being arranged so the voltage developed across the first capacitor has a value commensurate with the average value of the current flowing in the first variable impedance means, the second variable impedance charging network including variable impedance means for supplying current indicative of current flowing in the secondary winding to the second capacitor in response to the secondary winding voltage magnitude being greater by a predetermined value than the magnitude of the voltage across the second capacitor while the secondary winding voltage has a second polarity and while the secondary winding voltage magnitude is greater than voltage across the second capacitor, the impedance of the second variable impedance means varying while current is supplied to the second capacitor, the second charging network being arranged so the voltage developed across the second capacitor has a value commensurate with the average value of the current flowing in the second variable imepdance means; the values of components in the first and second charging networks, the discharge network and the capacitors being such thast DC voltages developed across the capacitors are substantially constant during steady state operastion of the transformer in response to the AC line current; and means for linearly combining signals indicative of the mangitudes of the voltages across the first and second capacitors to derive the third signal, the third signal having an amplitude and polarity respectively indicative of the level and polarity of DC magnetic flux bias in the core.

9. The apparatus of claim 8 wherein the means for lineraly combining includes an operational amplifier having a virtual ground potential input terminal responsive to discharge currents flowing from the first and second capacitors through the discharge network, first and second resistors respectively connected between the first and second capacitors and said input terminals, the resistors and capacitors having values to cause, in steady state operation, discharge of the first capacitor during each cycle of the AC current by the same amount as the first capacitor is charged during each cycle of the AC current and the discharge of the second capacitor during each cycle of the AC current by the same amount as the second capacitor is charged during each cycle of the AC current.

10. The apparatus of claim 8 wherein the first and second variable impedance means respectively include first and second silicon diodes poled to pass opposite polarity currents to the first and second capacitors.

11. The apparatus of claim 10 wherein the first and second diodes are respectively connected in series with: the secondary winding and the first and second capacitors, the first and second capacitors being connected in shunt to be responsive to the currents respectively flowing from the secondary winding to the first and second charging circuits and to supply current to the discharge network.

12. The apparatus of claim 1 wherein the first signal deriving means includes integrator means responsive to a signal representing a replica of current flowing in the seocndary winding.

13. The apparatus of claim 12 wherein the integrator means includes an operational amplifier having an inverting input terminal responsive to a voltage that is a replica of current flowing in the secondary winding and an output terminal, and a feedback capacitor connected between the input and output terminals.

14. The apparatus of 13 wherein the feedback capacitor is shunted by a stabilizing resistor.

15. The apparatus of claim 13 wherein the second signal deriving means includes means for derving a bi-level signal having equal and opposite polarities with transitions synchronized with polarity transitions of the signal at the operational amplifier output terminal, and low pass filter means for deriving a DC signal having a value proportional to the average value of the bi-level signal, the DC signal controlling the amplitude of the second signal.

16. A method of compensating for DC current flowing in a primary winding of a transformer having a secondary winding and a magnetic core with a B-H curve, the DC current having a tendency to supply DC magnetic flux to the core to bias the core so an operating point thereof is displaced from a zero flux position on the B-H curve thereby to cause positive and negative AC current components in the secondary winding to have different amplitudes and different time durations, the method comprising the steps of responding to the positive current components to derive a first indication of the average value of the positive current components, responding to the negative current components to dervie a second indication of the average value of the negative current components, comparing the amplitudes of the first and second indications to derive a third indication for the relative values of the average values of the positive and negative components, and controlling the DC magnetic flux supplied to said core in response to the third indication to overcome the tendency of the core to be biased away from the zero flux position.

* * * * *